(12) United States Patent
Ryu

(10) Patent No.: US 7,122,959 B2
(45) Date of Patent: Oct. 17, 2006

(54) ORGANIC ELECTROLUMINESCENT DISPLAY

(75) Inventor: Woon Seon Ryu, Ulsan (KR)

(73) Assignee: Samsung SDI Co., Ltd., Suwon-si (KR)

(*) Notice: Subject to any disclaimer, the term of this patent is extended or adjusted under 35 U.S.C. 154(b) by 253 days.

(21) Appl. No.: 10/647,143

(22) Filed: Aug. 25, 2003

(65) Prior Publication Data
US 2004/0119408 A1 Jun. 24, 2004

(30) Foreign Application Priority Data
Aug. 23, 2002 (KR) .................. 10-2002-0050129

(51) Int. Cl.
*H05B 33/04* (2006.01)
(52) U.S. Cl. .................. 313/512; 313/504
(58) Field of Classification Search ............. 313/512, 313/504–506, 463, 466, 483, 113, 114; 428/917
See application file for complete search history.

(56) References Cited

U.S. PATENT DOCUMENTS

| | | | |
|---|---|---|---|
| 4,488,084 A * | 12/1984 | Lindfors et al. | 313/506 |
| 4,963,788 A * | 10/1990 | King et al. | 313/503 |
| 5,047,687 A | 9/1991 | VanSlyke | |
| 5,059,861 A | 10/1991 | Littman et al. | |
| 5,059,862 A | 10/1991 | VanSlyke et al. | |
| 5,491,378 A * | 2/1996 | Lee et al. | 313/506 |
| 5,882,721 A | 3/1999 | Delnick | |
| 5,952,778 A * | 9/1999 | Haskal et al. | 313/504 |
| 6,635,989 B1 * | 10/2003 | Nilsson et al. | 313/512 |
| 6,784,612 B1 * | 8/2004 | Park et al. | 313/512 |
| 2002/0015818 A1 * | 2/2002 | Takahashi et al. | 428/76 |
| 2002/0146533 A1 * | 10/2002 | Chung et al. | 428/76 |

FOREIGN PATENT DOCUMENTS

JP 9-274990 10/1997

* cited by examiner

*Primary Examiner*—Ashok Patel
(74) *Attorney, Agent, or Firm*—Stein, McEwen & Bui, LLP

(57) ABSTRACT

An organic electroluminescent display includes a substrate; an organic electroluminescent unit including a first electrode unit formed on the substrate in a first predetermined pattern, an organic layer formed in a second predetermined pattern, and a second electrode unit on a top surface of the organic layer in a third predetermined pattern to be insulated from the first electrode unit; a sealing unit, which is joined with the substrate to hermetically seal the organic electroluminescent unit; and an anti-projection unit, which is installed on at least one of the substrate, the organic electroluminescent unit, and the sealing unit, preventing an image of an interior structure of the organic electroluminescent display from being projected on the substrate.

12 Claims, 3 Drawing Sheets

ORGANIC ELECTROLUMINESCENT DISPLAY

CROSS-REFERENCE TO RELATED APPLICATIONS

This application claims the benefit of Korean Application No. 2002-50129, filed Aug. 23, 2002, in the Korean Intellectual Property Office, the disclosure of which is incorporated herein by reference.

BACKGROUND OF THE INVENTION

1. Field of the Invention

The present invention relates to an organic electroluminescent display, and, more particularly, to an improved organic electroluminescent display of which the interior structure is prevented from being projected on an image forming portion through electrodes.

2. Description of the Related Art

Generally, organic electroluminescent displays are self-luminescent displays which emit light by electrically exciting a fluorescent organic compound. They can be operated with a low voltage, and can be made to be thin. In addition, organic electroluminescent displays have advantages, such as a wide viewing angle and a fast response speed, that overcome the problems of liquid crystal displays. Accordingly, they have been noted as next generation displays.

In the operation of organic electroluminescent displays, electrons are moved from a cathode to a luminescent layer via an electron transport layer, and holes are moved from an anode to the luminescent layer via a hole transport layer. The electrons meet the holes in the luminescent layer, which is organic and disposed between the cathode and the anode, thereby generating excitons having high energy. The excitons having high energy make transitions to having low energy, thereby producing light. Various colors can be implemented, depending on the type of organic material the luminescent layer is composed of.

In the meantime, the organic material used for organic electroluminescent displays is greatly influenced by moisture and oxygen. Moisture and oxygen cause many problems, such as degrading the characteristics of the organic material, lifting off a cathode, and shortening the life span of the organic electroluminescent display.

In order to protect the organic layer from moisture and impurities included in the air, organic electroluminescent displays are encapsulated. Encapsulation is implemented by bonding a metal cap or glass cap to a transparent substrate having an organic layer, using an adhesive.

Such encapsulation structures are disclosed in U.S. Pat. Nos. 5,059,862, 5,047,687, and 5,059,861. In these encapsulation structures, a capping layer is formed on the top surface of a dielectric layer. In Japanese Patent Publication hei 9-274990, a structure in which an organic layer is wrapped by a polyurethane encapsulation layer, which is wrapped by an external air blocking layer containing a desiccant, is disclosed. In a structure disclosed in U.S. Pat. No. 5,882,721, a glass sealing case is installed at a transparent substrate having an organic layer to wrap the organic layer, and a sealed space defined by the glass sealing case and the transparent substrate is filled with inert gas.

In the above-described encapsulation structures, a first electrode is formed of a transparent material, and a second electrode is formed by evaporating aluminum or the like, so the interior structure of an organic electroluminescent display may be exposed through the first and second electrodes. When the internal structure is projected on a transparent substrate on which an image is formed, there is a degradation in the resolution of the image.

SUMMARY OF THE INVENTION

The present invention provides an organic electroluminescent display which fundamentally prevents its internal structure from being projected on a transparent substrate, on which an image is formed, through electrodes in the organic electroluminescent display.

The present invention also provides an organic electroluminescent display which prevents the afterimage of a moisture-proof material and a porous tape, which are installed on the inside of a cap adhering to a transparent substrate, from being projected on the transparent substrate.

Additional aspects and/or advantages of the invention will be set forth in part in the description which follows and, in part, will be obvious from the description, or may be learned by practice of the invention.

According to an aspect of the present invention, there is provided an organic electroluminescent display including a substrate; an organic electroluminescent unit comprising a first electrode unit formed on the substrate in a first predetermined pattern, an organic layer formed in a second predetermined pattern, and a second electrode unit on a top surface of the organic layer in a third predetermined pattern to be insulated from the first electrode unit; a sealing unit, which is joined with the substrate to hermetically seal the organic electroluminescent unit; and an anti-projection unit, which is installed on at least one of the substrate, the organic electroluminescent unit, and the sealing unit, preventing an image of an interior structure of the organic electroluminescent display from being projected on the substrate.

BRIEF DESCRIPTION OF THE DRAWINGS

These and/or other aspects and advantages of the invention will become apparent and more readily appreciated from the following description of the preferred embodiments taken in conjunction with the accompanying drawings in which.

DETAILED DESCRIPTION OF THE PREFERRED EMBODIMENTS

Figure 1:
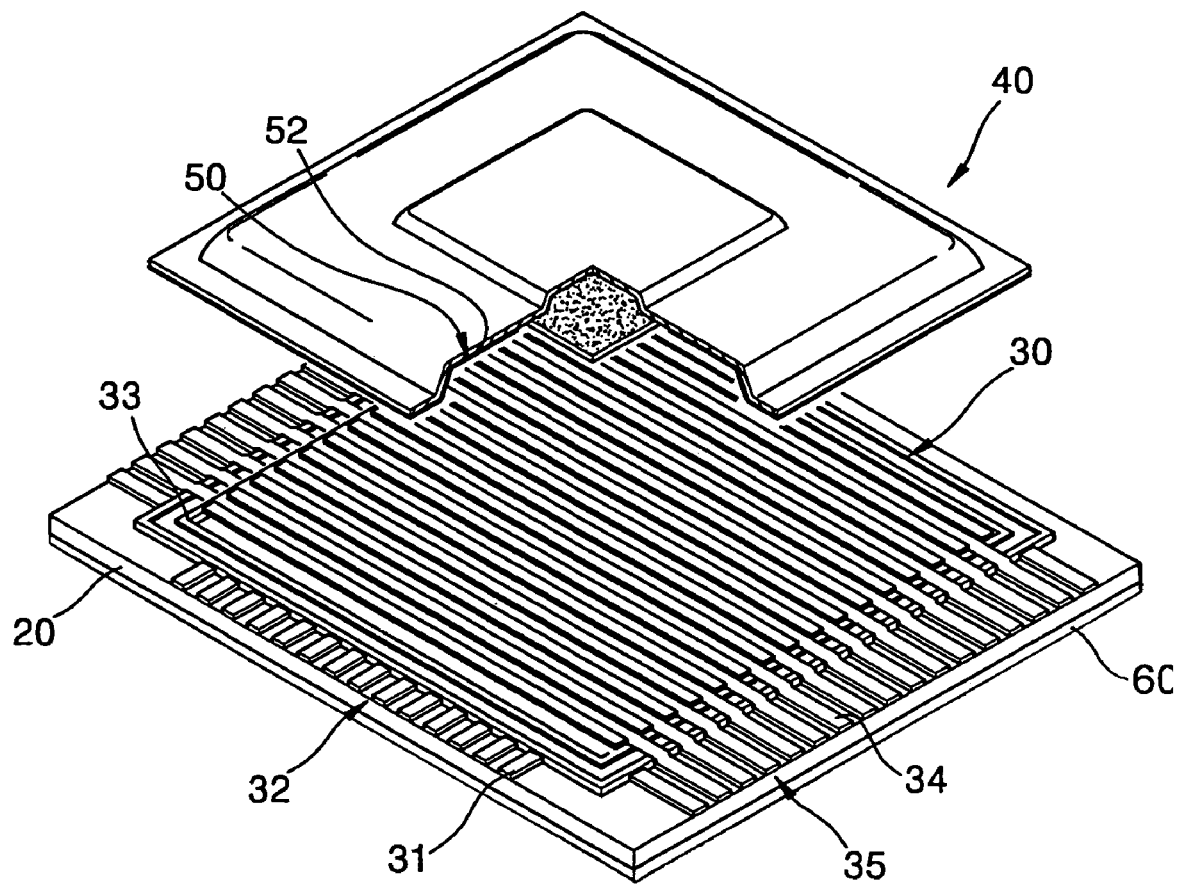
FIG. 1 is a partially cut-away perspective view of an organic electroluminescent display according to an embodiment of the present invention.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

FIG. 1 is a partially cut-away perspective view of an organic electroluminescent display according to an embodiment of the present invention. Referring to FIG. 1, the organic electroluminescent display includes a substrate 20 and an organic electroluminescent unit 30. The organic electroluminescent unit 30 includes a first electrode part 32, which has first electrode lines 31 formed on the substrate 20 in a predetermined pattern, i.e., in a pattern of stripes spaced a predetermined distance apart; an organic layer 33, which is formed on the top surface of the substrate 20 having the first electrode part 32, to correspond to the first electrode lines 31; and a second electrode part 35, which has second electrode lines 34 formed on the top surface of the organic layer 33 to be orthogonal to the first electrode lines 31. Although not shown, an internal insulation layer may be formed between the first electrode part 32 and the organic layer 33 in the organic electroluminescent unit 30 to have openings through which the first electrode lines 31 are exposed in a predetermined pattern so that the organic layer 33 can be formed on the top surface of the first electrode lines 31. In addition, a separator layer may be formed on the top surface of the internal insulation layer in order to separate the second electrode lines 34 constituting the second electrode part 35.

Figure 2:
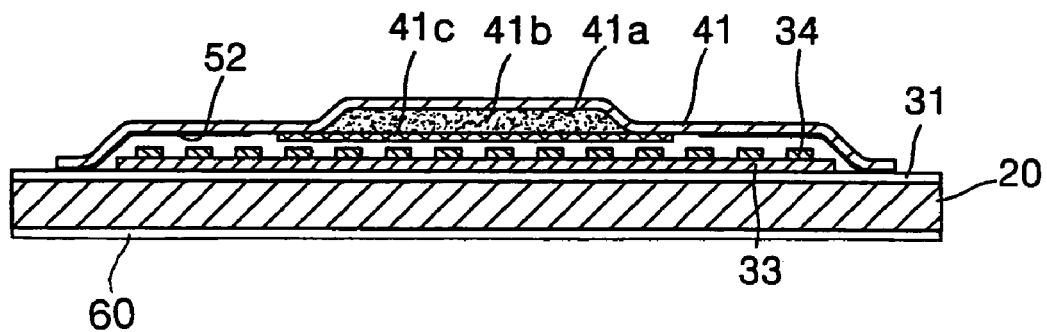
FIG. 2 is a cross-section of the organic electroluminescent display shown in FIG. 1.
Figure 3:
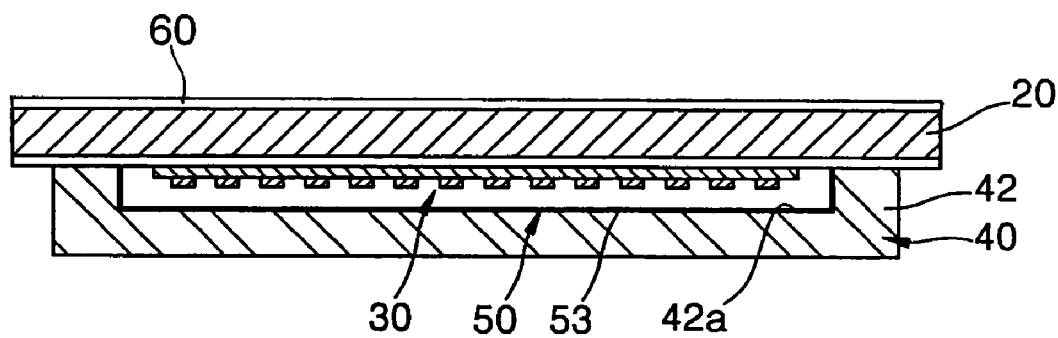
FIGS. 3 and 4 are cross-sections of organic electroluminescent displays according to other embodiments of the present invention.
Figure 4:
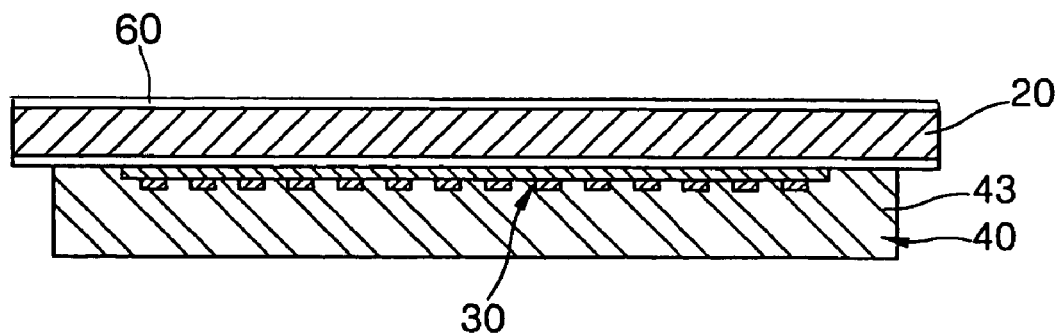

The organic electroluminescent display also includes a sealing unit 40, which is joined with the substrate 20 to hermetically encapsulate the organic electroluminescent unit 30. As shown in FIGS. 1 and 2, the sealing unit 40 is formed by bonding a metal cap 41 to the substrate 20. The metal cap 41 includes a cavity 41a inside, a moisture-proof material 41b filling the cavity 41a, and a porous tape 41c attached thereto in order to hold the moisture-proof material 41b within the cavity 41a. In another embodiment of the sealing unit 40, as shown in FIG. 3, a rear substrate 42, which is made of glass or a synthetic resin and has a recessed portion 42a at a portion corresponding to the organic electroluminescent unit 30, is joined with the substrate 20. Like the metal cap 41, the rear substrate 42 may include a cavity filled with a moisture-proof material inside and a porous tape attached thereto to hold the moisture-proof material within the cavity. As shown in FIG. 4, still another embodiment of the sealing unit 40 may be implemented by an encapsulator 43 which encapsulates the organic electroluminescent unit 30 with a resin, which may be made of a black synthetic resin wrapping the organic electroluminescent unit 30.

Figure 5:
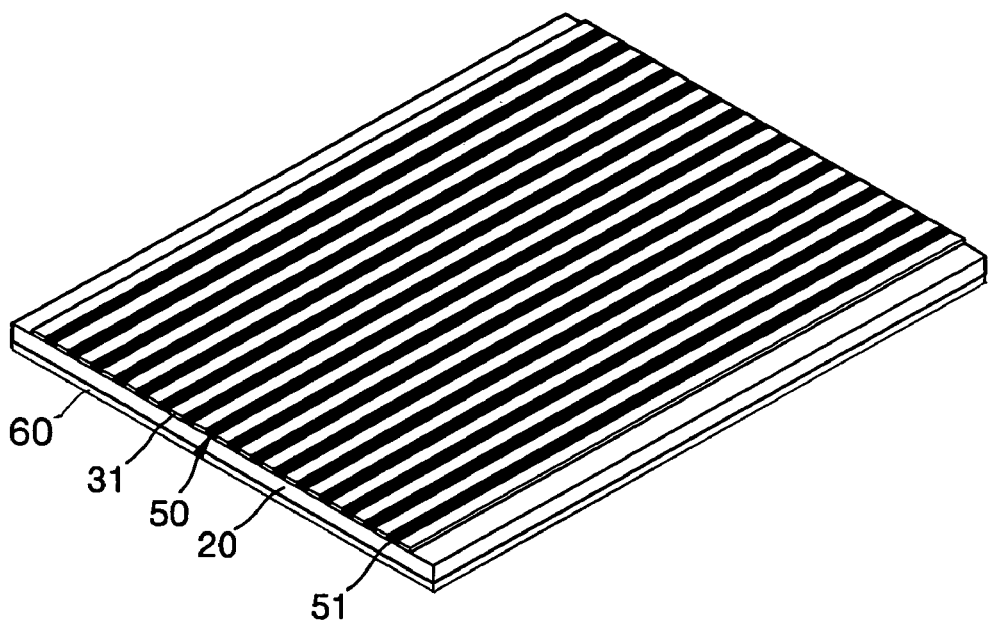
FIG. 5 is a perspective view of an anti-projection unit according to an embodiment of the present invention.
Figure 6:
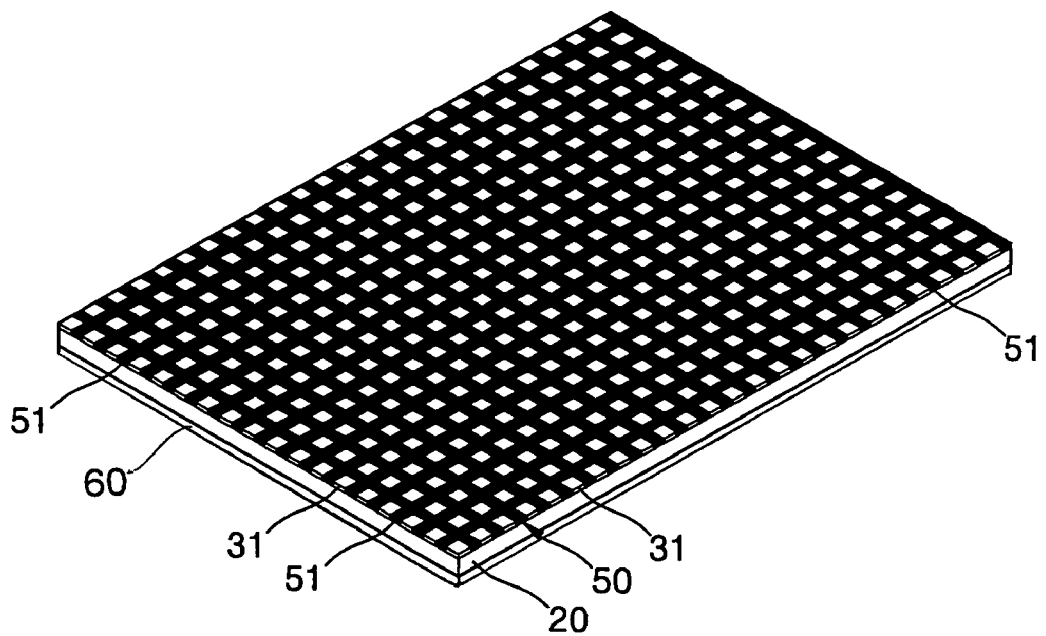
FIG. 6 is a perspective view of an anti-projection unit according to another embodiment of the present invention.

In the meantime, as shown in FIG. 5, an anti-projection unit 50 may be implemented by forming an opaque insulation layer 51 among the first electrode lines 31 of the first electrode unit 32. Alternatively, as shown in FIG. 6, the anti-projection unit 50 may be implemented by forming an opaque insulation layer 51 in the entire area of the substrate 20 except for a pixel area, i.e., in a nonluminescent area. It is preferable that the opaque insulation layer 51 is black, so as to serve as a black matrix.

When the sealing unit 40 is implemented by the metal cap 41, as shown in FIGS. 1 and 2, the anti-projection unit 50 may be implemented by forming a black coating layer 52 on the inside of the metal cap 41, or using a black porous tape 41c.

When the sealing unit 40 is implemented by the rear substrate 42 made of glass or a synthetic resin, as shown in FIG. 3, the anti-projection unit 50 may be implemented by forming a black coating layer 53 on the inside of the rear substrate 42, or manufacturing the rear substrate 42 in black so that external light is not radiated on the organic electroluminescent unit 30. In addition, it is preferable that the anti-projection unit 50 is made of an opaque material, regardless of the sealing unit 40, in order to maximally suppress the projection of the inner structure.

The organic electroluminescent display may also include a polarization plate 60 attached to the top surface of the substrate 20 as shown in FIGS. 1 to 6.

In an organic electroluminescent display having the structure of the above-described embodiments of the present invention, when a predetermined voltage is selectively applied to the first and second electrode lines 31 and 34 of the first and second electrode units 32 and 35, electrons in a first electrode line 31, to which a negative voltage is applied, move to a luminescent layer, i.e., the organic layer 33, via an electron transport layer, while holes in a second electrode line 34, to which a positive voltage is applied, move to the organic layer 33 via a hole transport layer. The electrons meet the holes in the organic layer 33, disposed between the first and second electrode units 32 and 35, thereby generating excitons having high energy. The excitation field having high energy makes a transition to having low energy, thereby producing light and forming an image.

During the above-described image formation, an anti-projection unit formed on at least one of the substrate 20, the organic electroluminescent unit 30, and the sealing unit 40 can prevent the interior structure of the organic electroluminescent display from being projected on the substrate 20 on which an image is formed. More specifically, since the opaque insulation layer 51 is formed among the first and second electrode lines 31 and 34 of the organic electroluminescent unit 30, or formed in a nonluminescent area in which an image is not formed, it prevents residual light in the organic electroluminescent display from being projected on the substrate 20 through the nonluminescent area. In particular, degradation of luminance due to the residual light can be prevented.

Alternatively, when the black coating layer 52 or 53 is formed on the inside of the metal cap 41 or the rear substrate 42, or when the metal cap 41 is made of an opaque material or the rear substrate 42 is made of a semitransparent material, light radiated from the organic electroluminescent unit 30 is absorbed so that the interior structure is prevented from being projected on the substrate 20.

As described above, an organic electroluminescent display according to embodiments of the present invention prevents the image of its interior structure from being projected on a substrate on which an image is formed, and thus prevents the image from being distorted due to the image of the interior structure.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An organic electroluminescent display comprising:
   a substrate;
   an organic electroluminescent unit comprising:
   a first electrode unit formed on the substrate in a first predetermined pattern,
   an organic layer formed in a second predetermined pattern, and
   a second electrode unit formed on a surface of the organic layer in a third predetermined pattern so that the organic layer is between the first electrode unit and the second electrode unit and the second electrode unit is insulated from the first electrode unit;
   a sealing unit, which is joined with the substrate to hermetically seal the organic electroluminescent unit;

an anti-projection unit, which is installed on at least one of the substrate, the organic electroluminescent unit, and the sealing unit, preventing an image of an interior structure of the organic electroluminescent display from being projected on the substrate;
a cap having a cavity;
a moisture-proof material provided in the cavity; and
a porous tape attached to the cap to hold the moisture-proof material within the cavity;
wherein either
  (1) the anti-projection unit comprises a black coating layer formed on the inside of the cap, or
  (2) the porous tape is black and the anti-projection unit comprises the black porous tape.

2. The organic electroluminescent display of claim 1, wherein the anti-projection unit comprises a black coating layer formed on the inside of the cap.

3. The organic electroluminescent display of claim 2, wherein the cap is made of an opaque material.

4. The organic electroluminescent display of claim 1, wherein the porous tape is black; and
  wherein the anti-projection unit comprises the black porous tape.

5. An organic electroluminescent display comprising:
a substrate having a front surface and a rear surface;
an organic electroluminescent unit comprising:
  a first electrode unit formed on the rear surface of the substrate in a first predetermined pattern,
  an organic layer formed ina second predetermined pattern, and
  a second electrode unit formed on a surface of the organic layer in a third predetermined pattern so that the organic layer is between the first electrode unit and the second electrode unit and the second electrode unit is insulated from the first electrode unit;
a sealing unit, which is joined with the rear surface of the substrate to hermetically seal the organic electroluminescent unit;
an anti-projection unit, which is installed on at least one of the substrate, the organic electroluminescent unit, and the sealing unit, preventing an image of an interior structure of the organic electroluminescent display from being projected on the substrate; and
a polarization plate attached to the front surface of the substrate;
wherein the sealing unit comprises a rear substrate having a recessed portion corresponding to the organic electroluminescent unit.

6. The organic electroluminescent display of claim 5, wherein a black coating layer is formed on the inside of the rear substrate.

7. The organic electroluminescent display of claim 5, wherein the rear substrate is black.

8. The organic electroluminescent display of claim 5, wherein the rear substrate is made of a semitransparent material.

9. The organic electroluminescent display of claim 5, wherein the rear substrate is made of glass or a synthetic resin.

10. The organic electroluminescent display of claim 5, wherein the rear substrate comprises:
a cavity;
a moisture-proof material provided in the cavity; and
a porous tape attached to the rear substrate to hold the moisture-proof material within the cavity.

11. An organic electroluminescent display comprising:
a substrate having a first surface and a second surface;
an organic electroluminescent unit comprising:
  a first electrode unit formed on the first surface of the substrate in a first predetermined pattern,
  an organic layer formed in a second predetermined pattern, and
  a second electrode unit formed on a surface of the organic layer in a third predetermined pattern so that the organic layer is between the first electrode unit and the second electrode unit and the second electrode unit is insulated from the first elecrode unit;
a sealing unit, which is joined with the substrate to hermetically seal the organic electroluminescent unit;
an anti-projection unit, which is installed on at least one of the substrate, the organic electroluminescent unit, and the sealing unit, preventing an image of an interior structure of the organic electroluminescent display from being projected on the substrate;
an internal insulation layer formed between the first electrode unit and the organic layer, having openings through which the first electrode unit is exposed to the organic layer; and
a polarization plate attached to the second surface of the substrate.

12. The organic electroluminescent display of claim 11, further comprising a separator layer formed on the internal insulation layer.

* * * * *

UNITED STATES PATENT AND TRADEMARK OFFICE
CERTIFICATE OF CORRECTION

| | | |
|---|---|---|
| PATENT NO. | : 7,122,959 B2 | Page 1 of 1 |
| APPLICATION NO. | : 10/647143 | |
| DATED | : October 17, 2006 | |
| INVENTOR(S) | : Woon Seon Ryu | |

It is certified that error appears in the above-identified patent and that said Letters Patent is hereby corrected as shown below:

Column 5, line 29, change "ina" to -- in a--

Signed and Sealed this

Twentieth Day of February, 2007

JON W. DUDAS
*Director of the United States Patent and Trademark Office*